(12) United States Patent
Rowell et al.

(10) Patent No.: US 10,575,196 B2
(45) Date of Patent: Feb. 25, 2020

(54) MEASUREMENT SYSTEM AND METHOD FOR TESTING A DEVICE UNDER TEST

(71) Applicant: Rohde & Schwarz GmbH & Co. KG, Munich (DE)

(72) Inventors: Corbett Rowell, Munich (DE); Vincent Abadie, Hoehenschaeftlarn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 7 days.

(21) Appl. No.: 15/945,469

(22) Filed: Apr. 4, 2018

(65) Prior Publication Data
US 2019/0313266 A1 Oct. 10, 2019

(51) Int. Cl.
*H04W 24/06* (2009.01)
*H04J 3/14* (2006.01)
(Continued)

(52) U.S. Cl.
CPC ........ *H04W 24/06* (2013.01); *G01R 29/0871* (2013.01); *H04B 17/104* (2015.01); *H04J 3/14* (2013.01)

(58) Field of Classification Search
CPC ................... G01N 21/59; G01N 21/55; G01N 2201/06113; G01N 21/7746; G01N 29/024; G01N 29/036; G01N 2291/02818; G01N 23/22; G01N 11/16; G01N 2203/0046; G01N 2291/0422; G01N 29/12; G01N 9/002; G01N 9/36; G01N 21/274; G01N 29/022; G01N 2291/014; G01N 2291/02827; G01N 29/4418; G01N 29/4436; G01N 29/4472; G01N 29/222; G01R 1/071; G01R 29/0814; G01R 29/0821; G01R 27/04; G01R 15/241; G01R 29/10; G01R 23/04; G01R 27/28; G01R 29/0871; G01R 31/2834; G01R 1/0408; G01R 31/31917; G01R 31/2621; G01R 31/2851; G01R 31/2889; G01R 31/3004;
(Continued)

(56) References Cited

U.S. PATENT DOCUMENTS 6,223,033 B1 * 4/2001 Lusterman ............. H01Q 1/242
455/425
9,277,501 B2 3/2016 Lorenz et al.
(Continued)

*Primary Examiner* — Nimesh Patel
(74) *Attorney, Agent, or Firm* — Christensen O'Connor Johnson Kindness PLLC

(57) ABSTRACT

A measurement system is described, comprising a signal processing equipment, an antenna unit, a device under test, and a resonant cavity surrounding the antenna unit and the device under test. The signal processing equipment is at least one of a signal generation equipment and a signal measurement equipment. The resonant cavity has a resonance for a frequency corresponding to at least one of the frequency used for testing the device under test and its multiples. The device under test is located within the resonant cavity such that a standing wave is established inside the resonant cavity during testing the device under test. The standing wave has an electric field distribution with maxima and minima. The antenna unit is located within the resonant cavity such that the antenna unit is assigned to a maximum of the electric field. Further, a method for testing a device under test is described.

12 Claims, 2 Drawing Sheets

(51) Int. Cl.
*H04B 17/10* (2015.01)
*G01R 29/08* (2006.01)

(58) Field of Classification Search
CPC ............ G01R 31/31813; G01R 31/386; G01R 31/02; G01R 31/2617; G01R 31/307; G01R 31/31915; G01R 31/318307; G01R 31/31924; H01L 33/105; H01L 33/145; F02M 35/1255; F02M 35/1266; G02B 2006/12138; G02B 6/12007; G06K 19/0722; H01S 5/0028; H01S 5/005; H01S 5/02415; H01S 5/18355; H01S 5/18397; H01S 5/02; H01S 1/06; H05B 6/705; H05B 6/72; B64G 1/52; B64G 1/66; B64G 9/00; H03L 7/26; H04W 64/00; H04W 88/06; H04W 88/02; H04W 4/023; H04W 4/025; H04W 4/90; H04W 4/02; H04W 4/046; H04W 4/80; H04W 84/12; H04W 24/06; H04B 1/709; H04B 2201/70715; H04B 7/04; H04B 7/2628; H04B 7/0413; H04B 1/69; H04B 1/707; H04B 1/1036; H04B 3/466; H04B 17/104; H04L 27/2627; H04L 27/2649; H04L 27/2017; H04L 27/2601; H04L 27/0008; H04L 5/0007; H04L 1/0003; H04L 27/2071; H04L 27/2602; H04L 63/0876; H04L 63/0861; H04L 63/107; H04L 5/0023; A61B 5/0015; A61B 5/0022; A61B 5/01; A61B 5/14532; A61B 5/002; A61B 5/0077; A61B 5/7228; H04M 2242/30; H04M 3/382; H04M 1/72533; H04M 7/006; H04M 2207/20; H04M 2242/04; H04M 3/26; G08C 17/02; G08C 2201/92; G08C 2201/93; G06F 11/2733; G06F 11/273; G06F 11/2736; G06F 17/5009; G01S 1/02; G01S 13/70; G01S 7/28; G01S 7/40; G05D 23/1393; G05D 1/0066; Y10T 307/76; Y10T 137/7761; Y10T 137/8225; Y10T 137/8242; Y10T 74/19405; G07C 3/005; G07C 3/14; H01P 1/213; H01P 5/183; H03B 5/34; H03B 5/32; H03G 3/24; H03G 3/26; H03G 3/3042; H03J 7/042; H03J 7/22; H04J 3/14

See application file for complete search history.

(56) References Cited

U.S. PATENT DOCUMENTS

| | | | |
|---|---|---|---|
| 9,781,623 B2 | 10/2017 | Seo et al. | |
| 9,823,294 B1* | 11/2017 | Aiello | G01R 31/2836 |
| 2012/0264377 A1* | 10/2012 | Seelenfreund | H04W 24/06 |
| | | | 455/67.11 |
| 2015/0153461 A1* | 6/2015 | Aoki | G01T 1/244 |
| | | | 250/370.07 |
| 2017/0223559 A1* | 8/2017 | Kong | H04B 7/0413 |
| 2017/0310402 A1* | 10/2017 | Wang | H04B 17/103 |

* cited by examiner

MEASUREMENT SYSTEM AND METHOD FOR TESTING A DEVICE UNDER TEST

TECHNICAL FIELD

Embodiments of the present disclosure relate to a measurement system as well as a method for testing a device under test.

BACKGROUND

Measurement systems as well as methods for testing a device under test such as a base station or a mobile user equipment, for instance a mobile phone, a tablet or any other suitable mobile end device, are known in the state of the art wherein different characteristics of the device under test can be tested appropriately.

Depending on the telecommunication standard used by the device under test, different characteristics are more important to be tested than other ones. For instance, new telecommunication standards such as the fifth generation wireless system, abbreviated by 5G, requires fast communication between the respective participants, for example communication in real time. Accordingly, different characteristics of a device under test to be used in a 5G telecommunication standard are of interest than the characteristics of a device under test used in the 4G telecommunication standard, for instance response times, reaction times and/or processing times.

So far, the devices under test are tested by so-called conducted measurements in order to verify the respective characteristics of the device under test used in the 4G telecommunication standard. However, this type of measurement cannot be used for testing a device under test with respect to the 5G telecommunication standard, for example for testing the characteristics being of interest.

SUMMARY

In view of the above, there is a need for a measurement system as well as a method for testing a device under test that can be carried out in a fast, simple and cheap manner so that characteristics of the device under test being important with regard to new telecommunication standards can be tested appropriately.

Embodiments of the present disclosure aim to address this need and/or others, and generally relate to a measurement system for testing a device under test, comprising:
 a signal processing equipment;
 an antenna unit;
 a device under test; and
 a resonant cavity surrounding the antenna unit and the device under test,
 the signal processing equipment being at least one of a signal generation equipment and a signal measurement equipment, the resonant cavity having a resonance, for example high-order mode resonance, for a frequency corresponding to at least one of the frequency used for testing the device under test and its multiples, the device under test being located within the resonant cavity such that a standing wave is established inside the resonant cavity during testing the device under test, the standing wave having an electric field distribution with maxima and minima, the antenna unit being located within the resonant cavity such that the antenna unit is assigned to a maximum of the electric field.

Further, embodiments of the present disclosure relate to a method for testing a device under test by using a measurement system, for instance a measurement system as mentioned above, with the following steps:
 sending a command to the device under test to turn off the device under test, and
 starting a measurement of the device under test during the power off state of the device under test.

Accordingly, it is possible to measure the radiation of the device under test during its power off status due to the fact that the antenna unit used for measuring the radiation transmitted by the device under test as well as the device under test are located within the resonant cavity that has a high-order mode resonance for the frequency used by the device under test so that any signal radiated by the device under test is intensified or rather amplified by the resonant cavity. Since the antenna unit is assigned to a maximum of the standing wave established within the resonant cavity, signals with low power can be detected appropriately by the antenna unit. Hence, the measurement results obtained are reliable.

Accordingly, it is possible to measure the power off state of the device under test as this state corresponds to a state in which the device under test should not radiate any signal anymore. In fact, the device under test is expected to send nothing, namely no signal, in its respective power off state.

Generally, the power off state of the device under test may correspond to a downlink off state and/or an uplink off state depending on the type of the device under test to be tested. Accordingly, neither downlink signals nor uplink signals are transmitted by the respective device under test during its respective power off status.

The device under test can be established by a base station or a user end device such as a mobile phone, a tablet, a communication device of a car or any other device communicating with a base station.

In general, the device under test is a cellular device using a telecommunication standard, for instance the 5G telecommunication standard.

According to an aspect, the device under test is tested with regard to at least one of its downlink characteristics and its uplink characteristics, the resonance frequency of the resonant cavity corresponding to at least one of the downlink frequency and the uplink frequency. Accordingly, the resonance frequency of the resonant cavity corresponds to the respective frequency that is used for communication purposes by the device under test. Depending on the type of the device under test, the downlink characteristics or the uplink characteristics are tested.

Another aspect provides that the antenna unit is located in the near field of the device under test. This ensures that signals transmitted by the device under test can be detected by the antenna unit even though the signals have low power.

According to an embodiment, the antenna unit comprises a separately formed link antenna and a separately formed measurement antenna. The measurement antenna can be used for measuring signals transmitted by the device under test. Thus, the measurement antenna is configured to measure whether the device under test radiates no power during the power off state.

In some embodiments, the measurement antenna is assigned to the maximum of the electric field. Thus, a signal with low power would be detected by the respective measurement antenna of the antenna unit since the measurement antenna is located in an area in which the maximum of the standing wave is provided.

Moreover, the link antenna may be configured to communicate with the device under test and a control unit. Thus, the link antenna may be configured to initiate the turn off of the device under test. The link antenna may be controlled by the control unit in an appropriate manner. For instance, the control unit provides a signal to be transmitted by the link antenna.

For instance, the control unit is assigned to at least one of the signal processing equipment and a communication tester being formed separately with respect to the signal processing equipment. Hence, the signal processing equipment may initiate the turn off of the device under test by controlling the link antenna to send a respective signal to be received by the device under test.

Moreover, a separately formed communication tester may be used to initiate the turn off of the device under test by providing the respective signal to be transmitted via the link antenna.

Further, the signal processing equipment or rather the separately formed communication tester may be used to initiate the measurement. For this purpose, a separate signal may be sent to the antenna unit, for example the measurement antenna, to start the measurement.

According to another aspect, the antenna unit is a single antenna being configured to be operated in two different modes. Hence, the same antenna can be used as the link antenna and the measurement antenna so that two different operation modes are assigned to the same antenna. For instance, the antenna unit comprises a switch in order to switch between the two operation modes. In fact, the single antenna implements the link function and the measurement function of the separately formed link and measurement antennas.

The two different modes may relate to different frequencies. The command for turning off the device under test may use a frequency that differs from the frequency used for communication purposes such as the uplink frequency and/or the downlink frequency. Accordingly, triggering the measurement is done by a different frequency than the measurement itself.

Generally, the antenna unit may be configured to be operated in a measurement mode and a trigger mode, the trigger mode being used for starting the measurement. As mentioned above, the triggering may be done via the link antenna or the link function of the antenna unit so that the device under test is turned off appropriately. This signal, namely the signal for turning off the device under test, may be used as a trigger signal for the measurement so that the measurement is started.

Alternatively, a separate signal may be used for starting the measurement, for example triggering the measurement antenna or the measurement function of the single antenna. This separate signal may correspond to a uplink or downlink trigger provided by a simulator.

Furthermore, a simulator may be provided that is configured to generate a trigger for the antenna unit, for example the measurement antenna of the antenna unit. The trigger that initiates the measurement is generated by the simulator. The simulator may be part of the signal processing equipment and/or the control unit. In general, the simulator may be a base station simulator and/or a user end device simulator so that signals of a base station (for testing a user end device) and/or signals of a user end device (for testing a base station) can be generated by the simulator.

For instance, the measurement system is configured to send a command that corresponds to at least one of a downlink signal and an uplink signal in a time division duplex mode, the downlink/uplink signal assigning no uplink/downlink allocation to the device under test. For instance, the device under test, established by a user end device, receives a signal corresponding to a downlink signal, wherein this signal comprises the information that no uplink allocation is assigned to the device under test. Alternatively, the device under test, established by a base station, receives a signal corresponding to an uplink signal, wherein this signal comprises the information that no downlink allocation is assigned to the device under test. Accordingly, it can be expected that the device under test does not send any (uplink/downlink) signal during the upcoming uplink time or rather downlink time, respectively. This is, however, verified by the measurement system, for example the antenna unit.

For instance, the device under test is a mobile user equipment or a base station. The mobile user equipment may relate to a mobile phone, a tablet or any other suitable mobile end device which is typically used by a user. In general, the device under test corresponds to a cellular device operating, for example, according to one or more cellular protocols.

The measurement system may be configured to turn off the device under test, turning off the device under test initiating the testing of the device under test. Thus, the measurement is started by a triggering command that relates to the turning off of the device under test.

According to an aspect, the command sent is used as a trigger for the measurement. Thus, commanding the device under test to turn off simultaneously starts the measurement.

The command may be sent via a link antenna, the command triggering a measurement antenna to start the measurement. Thus, two different antennas may be assigned to the antenna unit that is used for turning off the device under test (remotely), for triggering the measurement as well as for carrying out the measurement of the device under test.

Another aspect provides that the command sent to the device under test corresponds to a downlink signal in a time division duplex mode (TDD mode), the downlink signal assigning no uplink allocation to the device under test. Thus, it is expected that the device under test does not transmit any signals during the uplink time since no uplink allocation was assigned to the device under test. This is verified by the measurement system, for example the antenna unit of the measurement system. This setup corresponds to testing a user end device.

Alternatively, the command sent to the device under test corresponds to an uplink signal in a time division duplex mode (TDD mode), the uplink signal assigning no downlink allocation to the device under test. This setup corresponds to testing a base station. Hence, it is expected that the device under test does not transmit any signals during the downlink time since no downlink allocation was assigned to the device under test. This is verified by the measurement system, for example the antenna unit of the measurement system. This setup corresponds to testing a base station.

According to another aspect, a simulator is provided that generates a trigger to start the measurement in order to measure whether the device under test radiates no power during the power off state of the device under test. The simulator may be a base station simulator that simulates a corresponding downlink signal in a time division duplex mode wherein this signal does not assign any uplink allocation to the device under test. Should the device under test, however, transmit a signal during the following uplink time, it is measured by the antenna unit appropriately, for example the measurement antenna.

Alternatively, the simulator may be a user end device simulator that simulates a corresponding uplink signal in a time division duplex mode wherein this signal does not assign any downlink allocation to the device under test. Should the device under test, however, transmit a signal during the following downlink time, it is measured by the antenna unit appropriately, for example the measurement antenna.

Furthermore, the measurement may be started during at least one of an uplink sub-frame and a downlink sub-frame, the respective sub-frame being assigned to the device under test. As mentioned above, it is expected that the device under test does not send any signal during the respective sub-frame since no uplink/downlink allocation was assigned to the device under test.

In fact, the measurement may be started during am uplink sub-frame assigned to the device under test. As mentioned above, it is expected that the device under test, for example the user end device, does not send any signal during the uplink sub-frame since no uplink allocation was assigned to the device under test.

Alternatively, the measurement may be started during a down-link sub-frame assigned to the device under test. As mentioned above, it is expected that the device under test, for example the base station, does not send any signal during the downlink sub-frame since no downlink allocation was assigned to the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
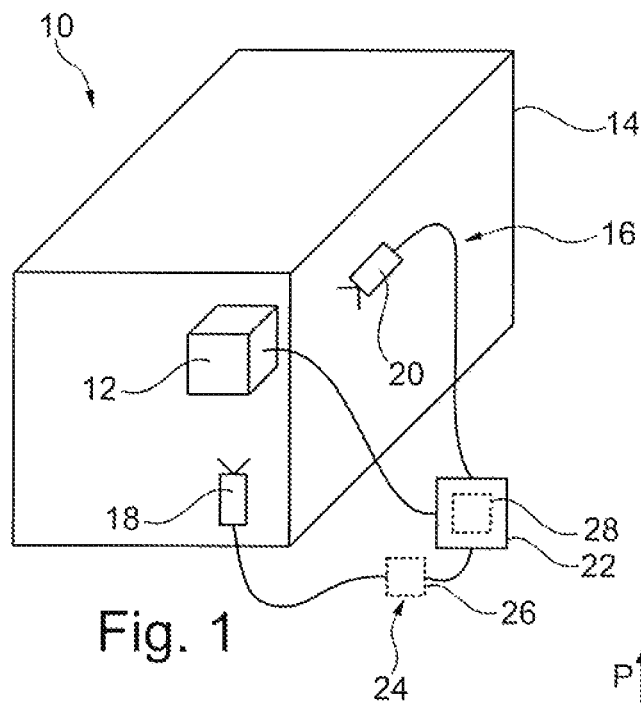
FIG. 1 schematically shows a measurement system according to an embodiment of the present disclosure.

In FIG. 1, a measurement system 10 is shown for testing a device under test 12 that is located within a resonant cavity 14 being part of the measurement system 10. The resonant cavity 14 surrounds the device under test 12 as well as an antenna unit 16 that is used for testing the device under test 12.

In the shown embodiment, the antenna unit 16 comprises a separately formed link antenna 18 as well as a separately formed measurement antenna 20. Both antennas 18, 20 are assigned to the device under test 12 for measuring purposes as will be described later with respect to FIG. 4.

The measurement system 10 also comprises a signal processing equipment 22 that is connected to the antenna unit 16, namely the link antenna 18 as well as the measurement antenna 20. The signal processing equipment 22 is also connected with a device under test 12 in order to analyze the device under test 12 appropriately. The signal processing equipment 22 may comprise a signal generation unit and/or a signal measurement unit. Thus, the signal processing equipment 22 may correspond to at least one of a signal generation equipment and a signal measurement equipment.

As already mentioned, the cavity 14 is a resonant cavity so that it has a resonance, particularly a high-order mode resonance, for a certain frequency. This frequency substantially corresponds to at least one of the frequency used for testing the device under test 12 and its multiples. The frequency used for testing the device under test 12 corresponds to the frequency that is typically used by the device under test 12 for communication purposes, namely the downlink frequency and/or the uplink frequency. Thus, the respective downlink/uplink frequency used by the device under test 12 is intensified by the resonant cavity 14 appropriately.

Figure 2:
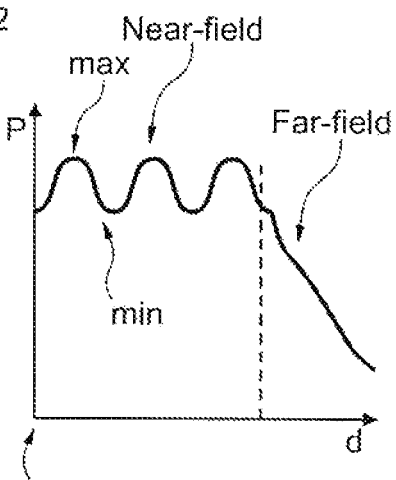
FIG. 2 shows a diagram representing the electric distribution of the standing wave used in the resonant cavity of the measurement system of FIG. 1, FIG. 3 schematically shows a measurement system according to another embodiment of the present disclosure.

The device under test 12 is placed within the resonant cavity 14 such that a standing wave is generated within the resonant cavity 14. This is schematically shown in the diagram of FIG. 2 wherein the power P of the standing wave is shown with respect to the distance d from the device under test 12. The diagram of FIG. 2 reveals that the standing wave has an electric field distribution with maxima (max) and minima (min) within the near field radiated by the device under test 12. The antenna unit 16, for example the measurement antenna 20, is assigned to one maximum of the electric field distribution of the standing wave established so that signals with low power can be detected by the antenna unit 16 appropriately, for example the measurement antenna 20.

As mentioned above, the resonant frequency of the resonant cavity corresponds to a frequency that is used by the device under test 12 for downlink and/or uplink purposes. Hence, the device under test 12 can be tested with regard to the downlink characteristics and the uplink characteristics depending on the kind of device under test.

For instance, the device under test 12 corresponds to a user equipment, also called user end device, so that its uplink characteristics are tested. Alternatively, the device under test 12 corresponds to a base station so that its downlink characteristics are tested.

Figure 4:
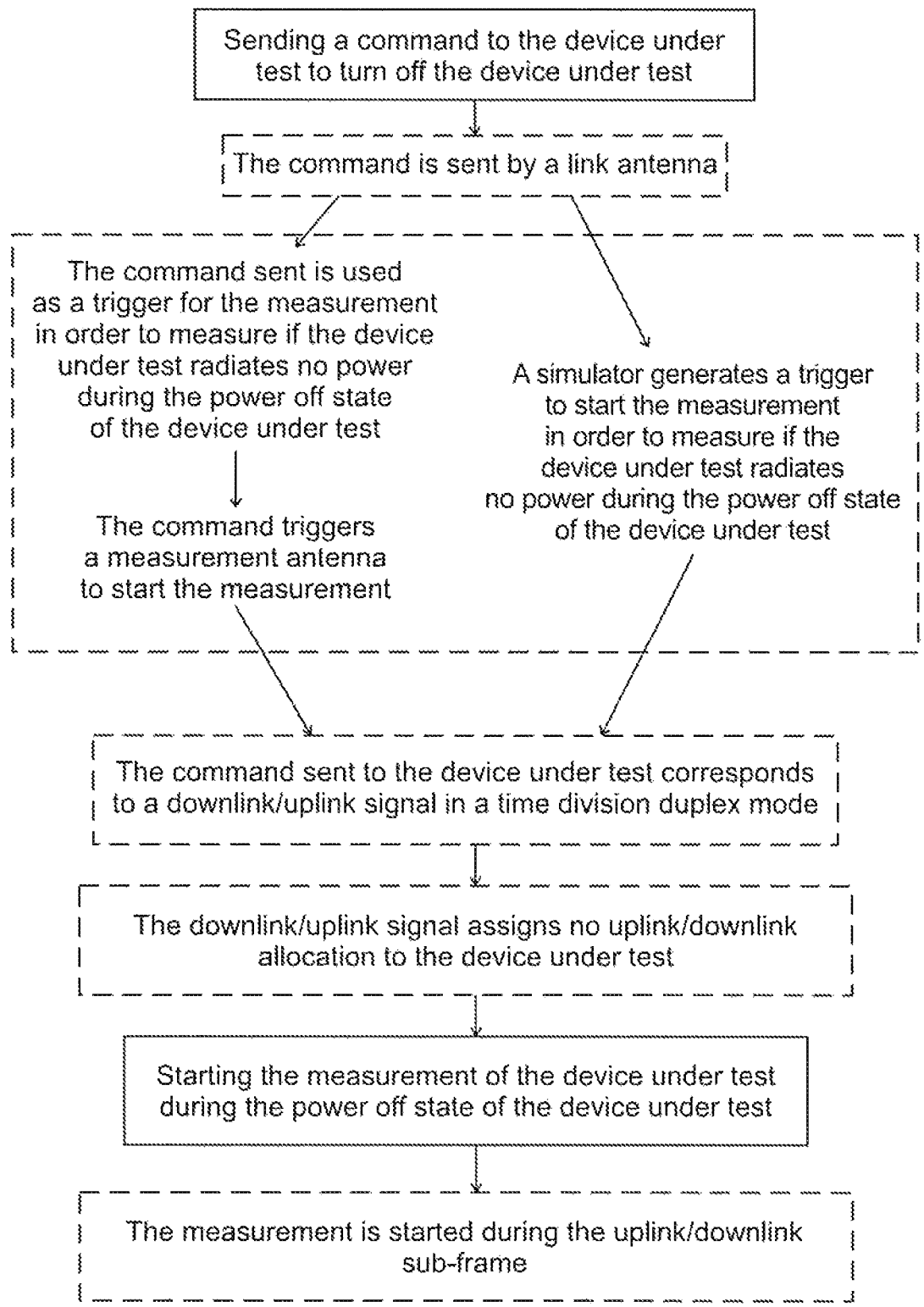
FIG. 4 shows a flowchart representing a method for testing a device under test according to an embodiment of the present disclosure.

As shown in FIG. 1, the link antenna 18 is configured to communicate with the device under test 12 as will be described later with regard to FIG. 4. Moreover, the link antenna 18 is connected to a control unit 24 that is established by a separately formed communication tester 26 with respect to the signal processing equipment 22. However, the control unit 24 may also be implemented in the signal processing equipment 22.

The control unit 24 controls the link antenna 18 appropriately so that a signal transmitted via the link antenna 18 is controlled by the control unit 24. In fact, the control unit 24 may provide the respective signal to be sent or controls the link antenna 18 such that the respective signal generated by another unit is transmitted.

Further, a simulator 28 is provided that may generate a certain trigger for the antenna unit 16 in order to initiate the measurement of the device under test 12 as will be described later with reference to FIG. 4. The simulator 28 may be a base station simulator and/or a user end device simulator so that the simulator 28 is configured to generate a downlink trigger and/or an uplink trigger for the antenna unit 16.

Figure 3:
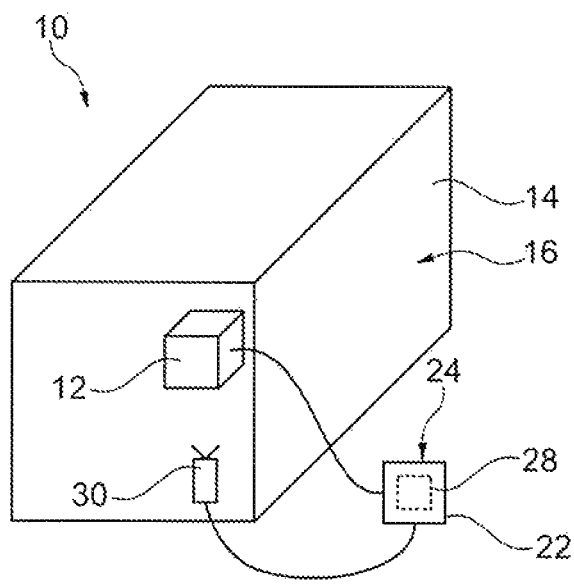

In FIG. 3, another embodiment of the measurement system 10 is shown that distinguishes from the embodiment shown in FIG. 1 in that the antenna unit 16 is established by a single antenna 30 that has a link function and a measurement function simultaneously. Accordingly, the single antenna 30 can be used instead of the link antenna 18 and the measurement antenna 20 shown in the embodiment of FIG. 1 as both functions are implemented in the single antenna 30. Furthermore, the control unit 24 is integrated in the signal processing equipment 22 so that the signal processing equipment 22 inter alia comprises the simulator 28 and the control unit 24.

Generally, the antenna unit 16 is configured to be operated in a measurement mode and a trigger mode. The trigger mode is used for starting the measurement whereas the measurement mode is used for measuring the device under test 12. The trigger mode may be established by a signal transmitted via the link antenna 18 that commands the device under test 12 to turn off. Alternatively, the trigger mode may be established by the simulator 28 that generates a trigger for the antenna unit 16, for example the measurement antenna 20.

The appropriate command (trigger) may be controlled by the control unit 24 or rather the simulator 28, for example the signal processing equipment 22. In the embodiment shown in FIG. 3, the control unit 24 may be assigned to a switch in order to switch between the two different operation modes of the single antenna 30, namely the trigger mode and the measurement mode.

Hereinafter the method for testing the device under test 12 by using the measurement system 10 is described wherein reference is made to the flow-chart shown in FIG. 4.

At the beginning, a command is sent to the device under test 12 so that the device under test 12 is turned off. This command is sent via the antenna unit 16, for example the link antenna 18. This command can be used as a trigger for the measurement so that the device under test 12 is measured during its power off state.

For doing so, the command is sent by the antenna unit 16 that is connected with the control unit 24 and/or the signal processing equipment 22. In some embodiments, the command is sent by the link antenna 18 being part of the antenna unit 16 as shown in FIG. 1. Alternatively, the command is sent by the single antenna 30 of the antenna unit 16 in the respective trigger mode.

The command for turning off the device under test 12 can be used simultaneously to trigger the antenna unit 16 to start the measurement. Hence, the respective command is used to switch from the trigger mode into the measurement mode. Alternatively, the command triggers the measurement antenna 20 to start the measurement of the device under test 12.

The command to turn off the device under test 12 may be sent by the simulator 28 that can be implemented in the signal processing equipment 22. Alternatively, the simulator 28 generates a (separate) trigger for the antenna unit 16 to start the measurement in order to measure if the device under test 12 radiates no power during the power off state of the device under test 12.

The command may correspond to a downlink signal in a time division duplex mode that is transmitted via the antenna unit 16, for example the link antenna 18. The downlink signal does not assign any uplink allocation to the device under test 12. Thus, it is expected that the device under test 12 does not send any signal as no uplink allocation was assigned to the device under test 12. Such a command is used for testing a user end device.

Alternatively, the command corresponds to an uplink signal in a time division duplex mode that is transmitted via the antenna unit 16, for example the link antenna 18. The uplink signal does not assign any downlink allocation to the device under test 12. Thus, it is expected that the device under test 12 does not send any signal as no downlink allocation was assigned to the device under test 12. Such a command is used for testing a base station.

As mentioned above, the measurement of the device under test 12 is started during the power off state of the device under test 12, namely the uplink off state or rather the downlink off state. This means that the measurement is started during the uplink sub-frame assigned to the device under test 12 or rather the downlink sub-frame assigned to the device under test 12 depending on the type of the device under test 12. Hence, it is verified whether the device under test 12 radiates any signal during the assigned uplink/downlink sub-frame even though no uplink/downlink allocation was assigned to the device under test 12.

The simulator 28 may generate a respective trigger for the antenna unit 16, for example the measurement antenna 20, namely an uplink trigger and/or a downlink trigger, depending on the device under test 12. The respective trigger provided by the simulator 28, namely the uplink trigger and/or the downlink trigger, is generated by using a signal generator in an arbitrary manner. The signal generator may be part of the signal processing equipment 22.

Generally, the two different modes, namely the trigger mode and the measurement mode, may relate to different frequencies so that the turning off command uses another frequency than the measurement frequency which relates to the downlink and/or uplink frequency of the device under test 12.

As mentioned above, the measurement system 10 is configured to turn off the device under test 12 wherein turning off the device under test 12 may simultaneously initiate the testing of the device under test 12 in order to verify whether signals are transmitted during the power off condition of the device under test 12.

The measurement system 10 as well as the method disclosed ensure that the power off status of the device under test 12 can be verified in a fast, simple and cheap manner.

Particularly, the respective tests can be done over-the-air so that no conducted measurements of the device under test 12 are required.

The signal processing equipment 22, the control unit 24, or other devices described herein may include, in some embodiments, logic for implementing the technologies and methodologies described herein. This logic can be carried out in either hardware or software, or a combination of hardware and software. In some embodiments, the signal processing equipment 22, the control unit 24, or other devices includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, such as memory elements, or combinations thereof.

In an embodiment, the signal processing equipment 22, the control unit 24, or other devices includes a microprocessor and a memory storing logic modules and/or instructions. In an embodiment, the signal processing equipment 22, the control unit 24, or other devices includes one or more ASICs having a plurality of predefined logic components. In an embodiment, the signal processing equipment 22, the control unit 24, or other devices includes one or more FPGA having a plurality of programmable logic components. In an embodiment, the signal processing equipment 22, the control unit 24, or other devices includes hardware circuit implementations (e.g., implementations in analog circuitry, implementations in digital circuitry, and the like, and combinations thereof). In an embodiment, the signal processing equipment 22, the control unit 24, or other devices includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing a device under test, comprising:
   a signal processing equipment, the signal processing equipment being a signal generation equipment or a signal measurement equipment;
   an antenna unit;
   a device under test; and
   a resonant cavity surrounding the antenna unit and the device under test, the resonant cavity having a resonance for a frequency corresponding to at least one of the frequency used for testing the device under test or its multiples;
   wherein the device under test is located within the resonant cavity such that a standing wave is established inside the resonant cavity during testing the device under test, the standing wave having an electric field distribution with maxima and minima, and wherein the antenna unit is located within the resonant cavity such that the antenna unit is assigned to a maximum of the electric field distribution,
   wherein the measurement system is configured to send a command that corresponds to at least one of a downlink signal or an uplink signal in a time division duplex mode, the downlink signal assigning no uplink allocation to the device under test or the uplink signal assigning no downlink allocation to the device under test, and
   wherein the measurement system is configured to turn off the device under test over-the-air, and wherein turning off the device under test initiates the testing of the device under test.

2. The measurement system according to claim 1, wherein the device under test is tested with regard to at least one of its downlink characteristics or its uplink characteristics, the resonance frequency of the resonant cavity corresponding to at least one of the downlink frequency or the uplink frequency.

3. The measurement system according to claim 1, wherein the antenna unit is located in the near field of the device under test.

4. The measurement system according to claim 1, wherein the antenna unit comprises a separately formed link antenna and a separately formed measurement antenna.

5. The measurement system according to claim 4, wherein the measurement antenna is assigned to the maximum of the electric field.

6. The measurement system according to claim 4, wherein the link antenna is configured to communicate with the device under test and a control unit.

7. The measurement system according to claim 6, wherein the control unit is assigned to at least one of the signal processing equipment or a communication tester being formed separately with respect to the signal processing equipment.

8. The measurement system according to claim 1, wherein the antenna unit is a single antenna being configured to be operated in two different modes.

9. The measurement system according to claim 8, wherein the two different modes relate to different frequencies.

10. The measurement system according to claim 1, wherein the antenna unit is configured to be operated in a measurement mode and a trigger mode, the trigger mode being used for starting the measurement.

11. The measurement system according to claim 1, wherein a simulator is provided that is configured to generate a trigger for the antenna unit.

12. The measurement system according to claim 1, wherein the device under test is a mobile user equipment or a base station.

* * * * *